(12) United States Patent
Huang et al.

(10) Patent No.: US 7,278,467 B2
(45) Date of Patent: Oct. 9, 2007

(54) LIQUID-COOLED HEAT RADIATOR KIT

(75) Inventors: Jung-Fong Huang, Sanchong (TW); Chih-Chien Huang, Sansia Township, Taipei County (TW)

(73) Assignee: Forward Electronics Co., Ltd., Taipei (TW)

( * ) Notice: Subject to any disclaimer, the term of this patent is extended or adjusted under 35 U.S.C. 154(b) by 400 days.

(21) Appl. No.: 11/088,868

(22) Filed: Mar. 25, 2005

(65) Prior Publication Data

US 2006/0090883 A1    May 4, 2006

(30) Foreign Application Priority Data

Nov. 3, 2004    (TW) ............... 93217604 U

(51) Int. Cl.
*H05K 7/20* (2006.01)
(52) U.S. Cl. .............. 165/80.4; 165/104.31; 165/104.33; 165/121; 361/697; 361/698; 361/699
(58) Field of Classification Search .......... 165/80.3, 165/80.4, 104.31, 104.33, 12; 361/697–699
See application file for complete search history.

(56) References Cited

U.S. PATENT DOCUMENTS

| | | | | |
|---|---|---|---|---|
| 1,996,622 A | * | 4/1935 | Lambert | 165/170 |
| 5,394,936 A | * | 3/1995 | Budelman | 165/104.33 |
| 5,940,270 A | * | 8/1999 | Puckett | 361/699 |
| 6,019,165 A | * | 2/2000 | Batchelder | 165/80.3 |
| 6,527,045 B1 | * | 3/2003 | Osakabe et al. | 165/104.33 |
| 6,591,898 B1 | * | 7/2003 | Chu et al. | 165/80.4 |
| 6,648,064 B1 | * | 11/2003 | Hanson | 165/120 |
| 6,662,858 B2 | * | 12/2003 | Wang | 165/80.3 |
| 6,722,139 B2 | * | 4/2004 | Moon et al. | 62/3.2 |
| 6,760,221 B2 | * | 7/2004 | Goth et al. | 361/699 |
| 6,766,817 B2 | | 7/2004 | da Silva | 137/1 |
| 6,856,037 B2 | * | 2/2005 | Yazawa et al. | 290/43 |
| 6,966,359 B1 | * | 11/2005 | Liu | 165/104.21 |
| 2002/0079095 A1 | * | 6/2002 | Davies et al. | 165/170 |
| 2003/0173061 A1 | * | 9/2003 | Lai et al. | 165/80.4 |
| 2004/0190253 A1 | * | 9/2004 | Prasher et al. | 361/699 |
| 2004/0238162 A1 | * | 12/2004 | Seiler et al. | 165/148 |
| 2005/0077028 A1 | * | 4/2005 | Oikawa | 165/80.4 |
| 2006/0237172 A1 | * | 10/2006 | Lo | 165/125 |

* cited by examiner

*Primary Examiner*—Allen J. Flanigan
(74) *Attorney, Agent, or Firm*—Bacon & Thomas PLLC

(57) ABSTRACT

A liquid-cooled heat radiator kit is disclosed to include a heat radiator, which has radiation elements at the top wall and parallel grooves at the bottom wall, two liquid-cooled heat pipes bilaterally arranged in parallel at the bottom side of the heat radiator, each liquid-cooled heat pipes having two close ends and a plurality of enclosed chambers spaced between the two close ends, and a plurality of straight flow-guide pipes respectively fastened to the grooves at the bottom side of the heat radiator and connected between the two liquid-cooled heat pipes to form with the enclosed chambers of the liquid-cooled heat pipes a detoured flow passage for the passing of a cooling fluid in one direction.

6 Claims, 7 Drawing Sheets

US 7,278,467 B2

LIQUID-COOLED HEAT RADIATOR KIT

BACKGROUND OF THE INVENTION

1. Field of the Invention

The present invention relates to heat radiators and more particularly, to a liquid-cooled heat radiator kit.

2. Description of Related Art

FIG. 1 illustrates the system architecture of a computer liquid-cooled heat radiator kit according to the prior art. FIG. 2 is an exploded view of the computer liquid-cooled heat radiator kit according to the prior art. FIG. 3 is an elevational assembly view of the computer liquid-cooled heat radiator kit according to the prior art.

The prior art computer liquid-cooled heat radiator kit 3 is to be used with a thermal collector 2 to form a fluid-cooled circulation system. When in use, the thermal collector 2 absorbs heat from the CPU 1, and the heat energy-carried fluid is delivered to the heat radiator kit 3 for dissipation of heat. After dissipation of heat, the fluid is returned to the thermal collector 2, forming a circulation cycle. In a simple word, the fluid-cooled circulation system works to dissipate heat from the CPU 1.

Due to the limitation of the turning angles 331 and arrangement of the coiled heat pipe 33 of the heat radiator kit 3, the contact area between the radiation fins 31 of the heat radiator kit 3 and the heat pipe 33 is reduced. Further, the heat pipe 33 is welded to a metal plate 32 and then the radiation fins 31 are fixedly fastened to the metal plate 32 with screws 34. This heat tube mounting design causes a heat dissipation loss. Therefore, this design of liquid-cooled heat radiator kit is not satisfactory in function.

SUMMARY OF THE INVENTION

The present invention has been accomplished under to provide a liquid-cooled heat radiator kit, which eliminates the aforesaid problems.

To achieve this and other objects of the present invention, the liquid-cooled heat radiator kit comprises a heat radiator, which comprises a plurality of radiation elements protruded from the top wall thereof and a plurality of parallel grooves formed in the bottom wall thereof, a first liquid-cooled heat pipe, which has two close ends and a plurality of side holes spaced between the two close ends, a second liquid-cooled heat pipe, which has two close ends and a plurality of side holes spaced between the two close ends, and a plurality of flow-guide pipes that are respectively mounted in the grooves of the heat radiator, each having a right end connected to one side hole of the first liquid-cooled heat pipe and a left end connected to one side hole of the second liquid-cooled heat pipe.

The first liquid-cooled heat pipe comprises a plurality of partition members, and a plurality of enclosed chambers separated from one another by the partition members. The second liquid-cooled heat pipe comprises a plurality of partition members, and a plurality of enclosed chambers separated from one another by the partition members. The enclosed chambers of the first liquid-cooled heat pipe and the enclosed chambers of the second liquid-cooled heat pipe are arranged in fluid communication with the left and right ends of the flow-guide tubes in such a manner that the enclosed chambers of the first liquid-cooled heat pipe and the second liquid-cooled heat pipe form with the flow-guide pipes a detoured flow passage for the passing of a cooling fluid in one direction. Because the flow-guide pipes are directly fastened to the grooves at the bottom wall of the heat radiator, much contact area is obtained between the heat radiator and the fluid-guide pipes to enhance heat dissipation effect. Further, because the flow-guide pipes are straight pipes, they can be arranged on the bottom wall of the heat radiator in a high density to increase the length of the detoured flow passage. Therefore, the fluid staying time in the liquid-cooled heat pipes is greatly increased to enhance cooling effect.

DETAILED DESCRIPTION OF THE PREFERRED EMBODIMENT

Figure 1:
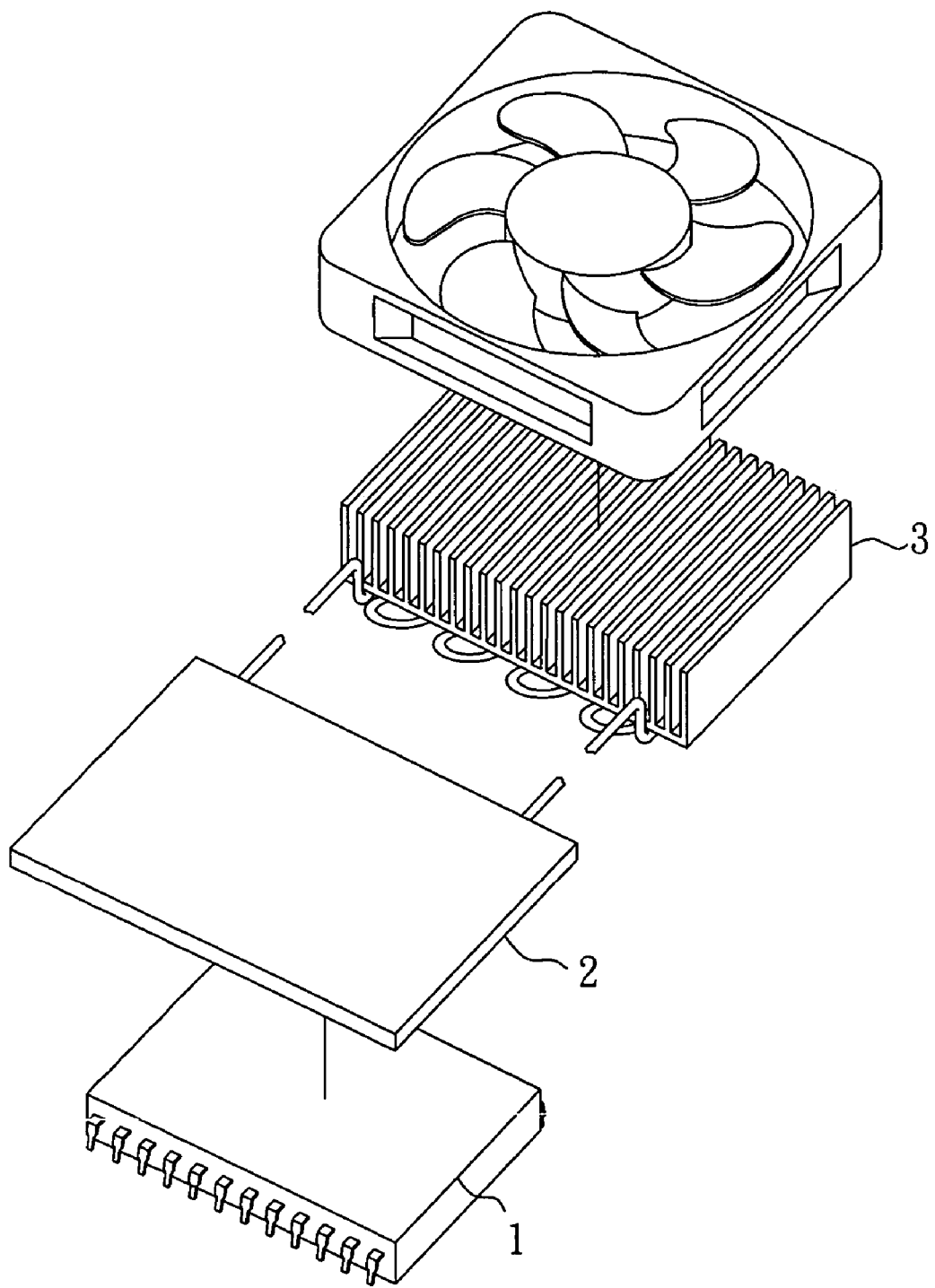
FIG. 1 illustrates the system architecture of a liquid-cooled heat radiator kit according to the prior art.
Figure 2:
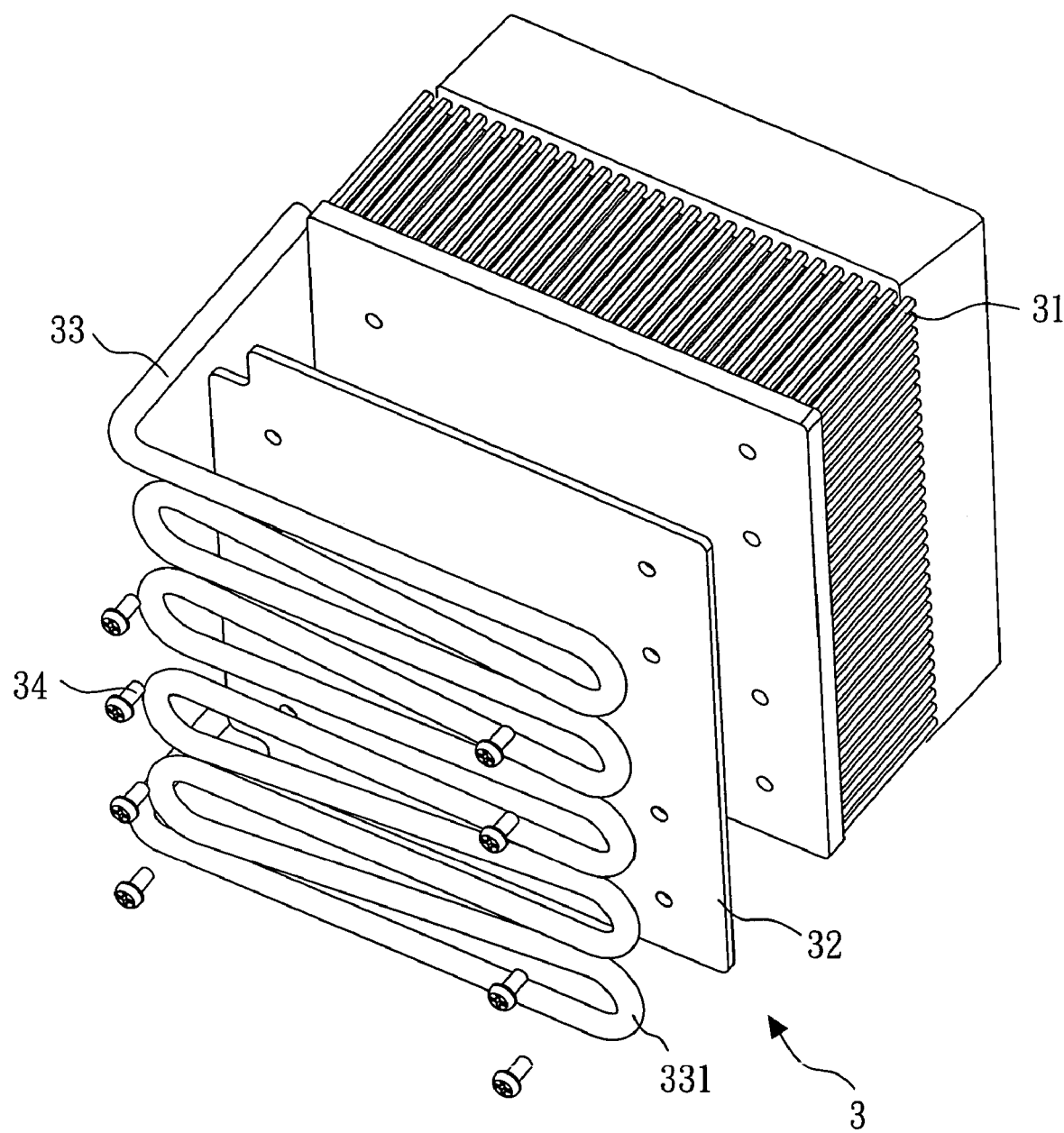
FIG. 2 is an exploded view of the liquid-cooled heat radiator kit according to the prior art.
Figure 3:
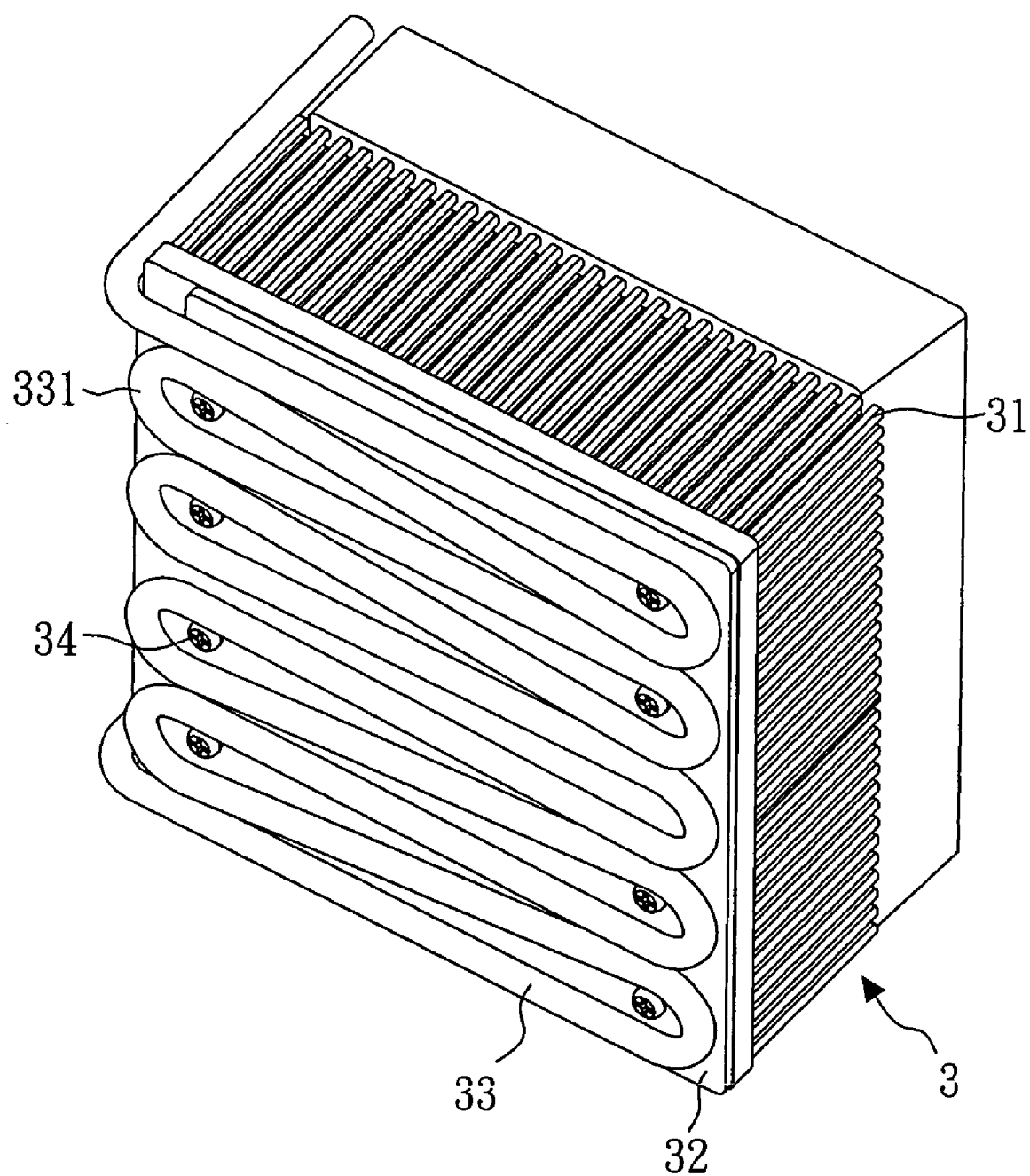
FIG. 3 is an elevational assembly view of the liquid-cooled heat radiator kit according to the prior art.
Figure 4:
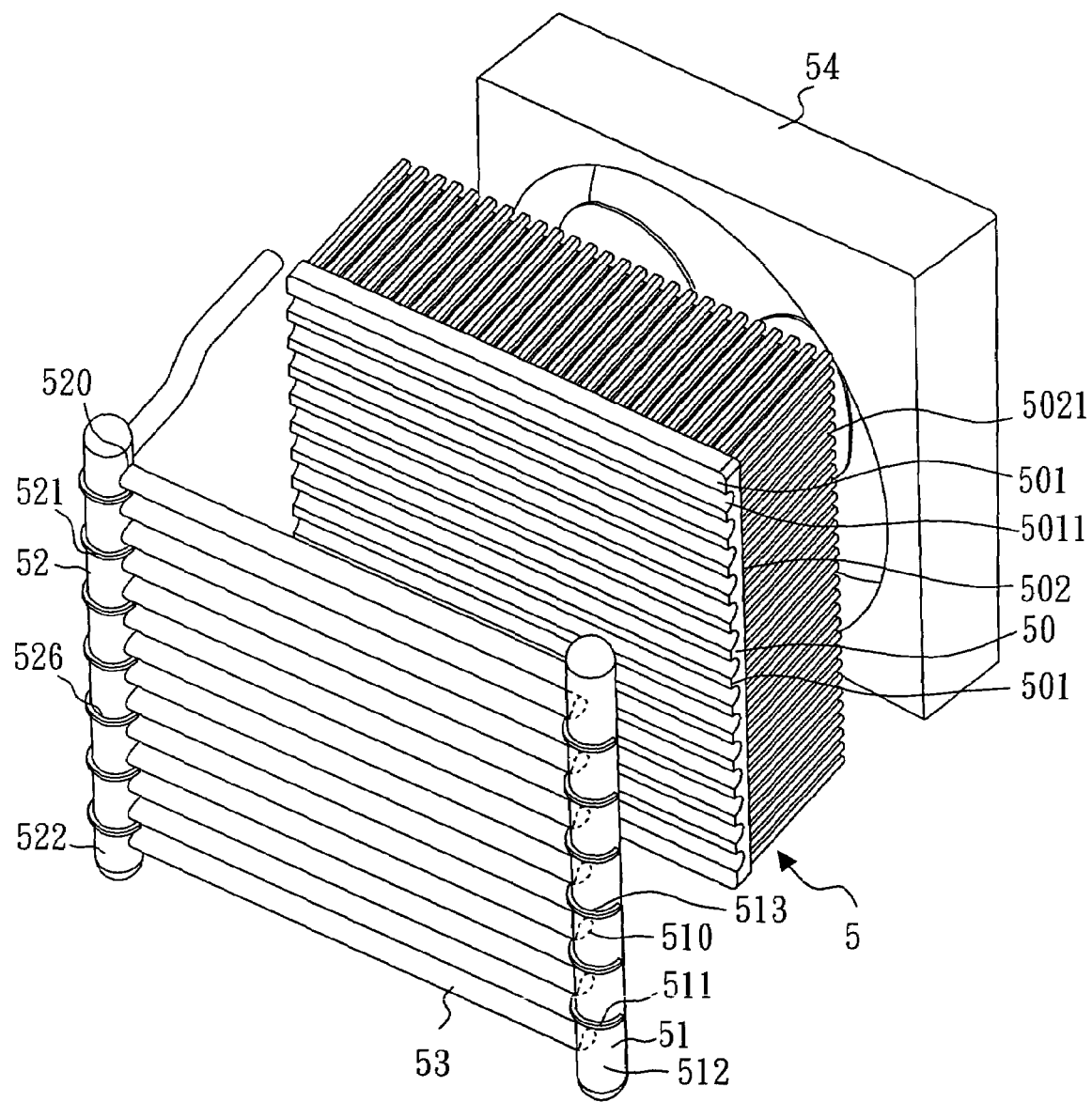
FIG. 4 is an exploded view of a liquid-cooled heat radiator kit according to the present invention.
Figure 5:
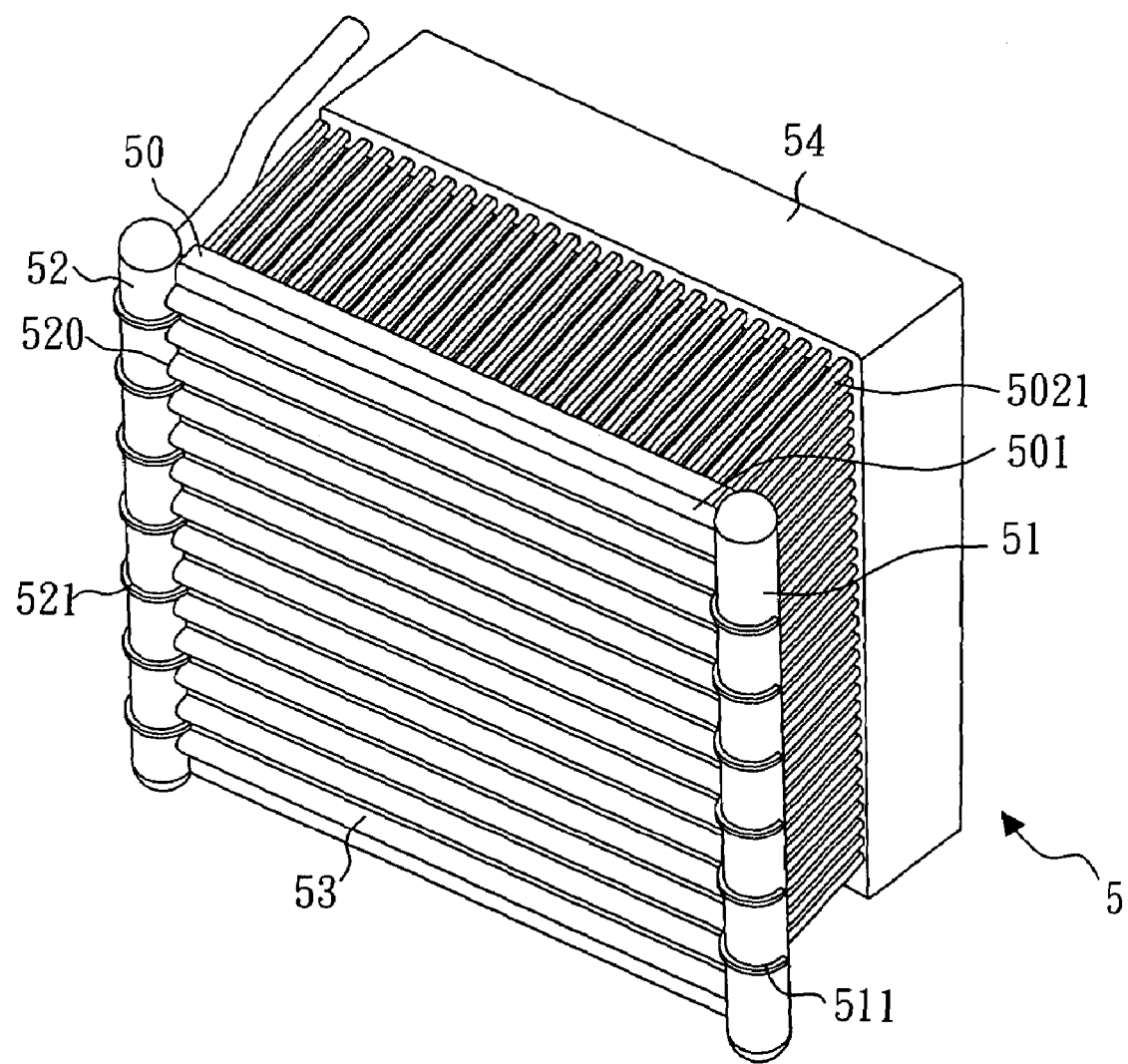
FIG. 5 is an elevational assembly view of the liquid-cooled heat radiator kit according to the present invention.
Figure 6:
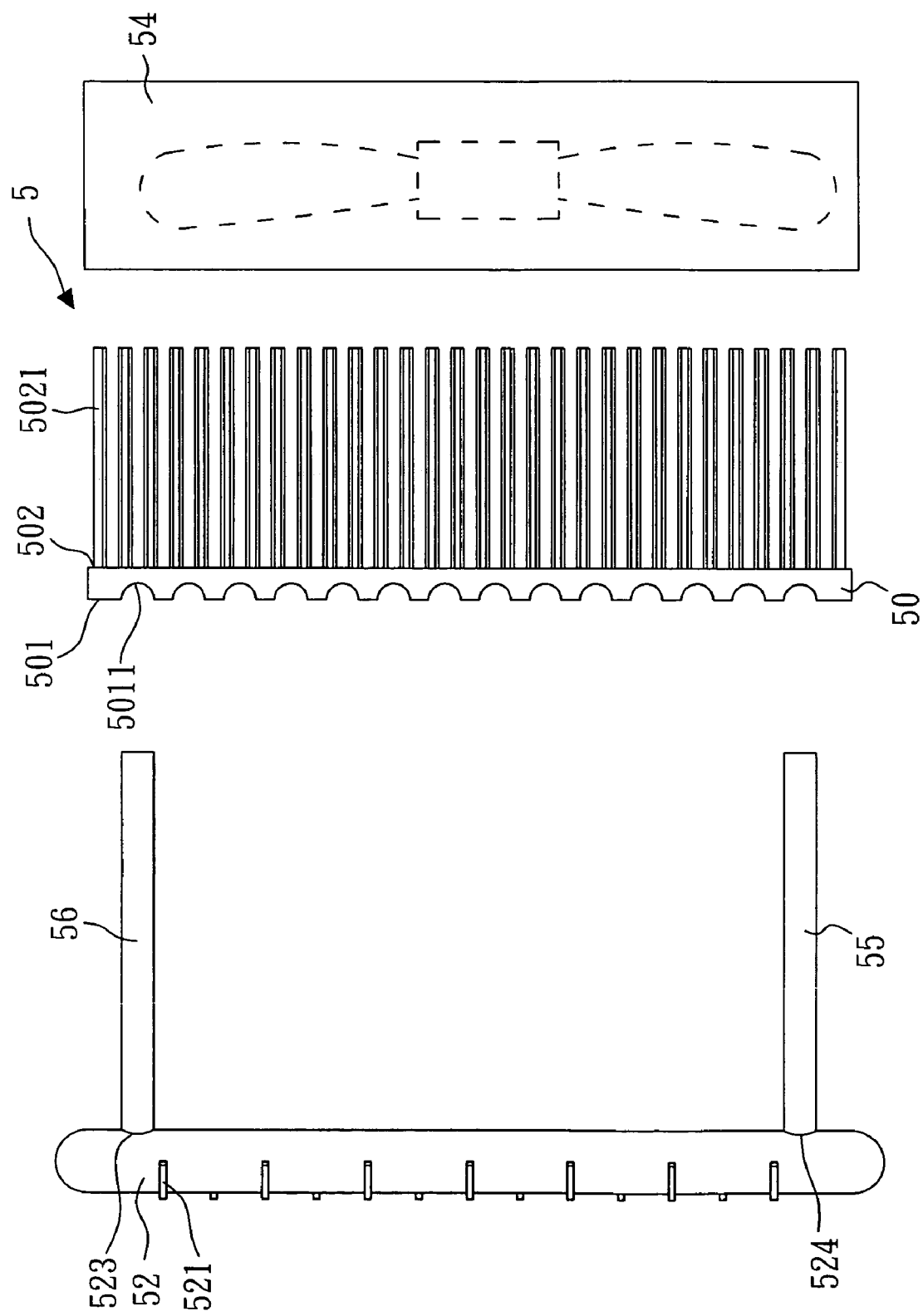
FIG. 6 is an exploded bottom view of the liquid-cooled heat radiator kit according to the present invention.

Referring to FIGS. 4~6, a liquid-cooled heat radiator kit 5 in accordance with the present invention is shown comprised of a heat radiator 50, which has a plurality of radiation elements, such as radiation elongations 5021 or radiation fins (not shown), protruded from the top wall 502 thereof and a plurality of parallel grooves 5011 formed in the bottom wall 501 thereof, a first liquid-cooled heat pipe 51, which has two end closed and a plurality of side holes 510 formed in the peripheral wall at different elevations between the two close ends, a second liquid-cooled heat pipe 52, which has two ends closed and a plurality of side holes 520 formed in the peripheral wall at different elevations between the two close ends, a plurality of flow-guide pipes 53 respectively fixedly mounted in the grooves 5011 of the heat radiator 50 with the respective right ends respectively connected to the side holes 510 of the first liquid-cooled heat pipe 51 and the respective left ends respectively connected to the side holes 520 of the second liquid-cooled heat pipe 52, and a fan 54 fastened to the radiation elongations 5021 at the top.

The first liquid-cooled heat pipe 51 comprises a plurality of partition members 511, which divide the inside space of the first liquid-cooled heat pipe 51 into a plurality of enclosed chambers 512. The second liquid-cooled heat pipe 52 comprises a plurality of partition members 521, which divide the inside space of the second liquid-cooled heat pipe 52 into a plurality of enclosed chambers 522. The first liquid-cooled heat pipe 51 and the second liquid-cooled heat pipe 52 are arranged in parallel. Further, the chambers 512 of the first liquid-cooled heat pipe 51 are arranged corresponding to the chambers 522 of the second liquid-cooled heat pipe 52. As illustrated, the first one of the chambers 522 of the second liquid-cooled heat pipe 52 is in fluid communication with the left end of the first one of the flow-guide pipes 53, the right end of the first one of the flow-guide pipes 53 is in fluid communication with the first one of the chambers 512 of the first liquid-cooled heat pipe 51, the first one of the chambers 512 of the first liquid-cooled heat pipe 51 is also in fluid communication with the right end of the second one of the flow-guide pipes 53, the left end of the second one of the flow-guide pipes 53 is in fluid communication with the second one of the chambers 522 of the second liquid-cooled heat pipe 52, the second one of the chambers 522 of the second liquid-cooled heat pipe 52 is also in fluid communication with the left end of the third one of the flow-guide pipes 53, the right end of the third one of the flow-guide pipes 53 is in fluid communication with the third one of the chambers 512 of the first liquid-cooled heat pipe 51, and so on, and therefore the chambers 522 of the second liquid-cooled heat pipe 52 form with the flow-guide pipes 53 and the chambers 512 of the first liquid-cooled heat pipe 51 a detoured flow passage.

Referring to FIGS. 4~6, the second liquid-cooled heat pipe 52 has a water inlet 523 in fluid communication with the first one of the chambers 522, a water outlet 524 in fluid communication with the last one of the chambers 522, a water inlet pipe 56 connected to the water inlet 523 for guiding in a cooling fluid into the detoured flow passage formed of the chambers 522, 512 and the flow-guide pipes 53, and a water outlet pipe 55 extending from the water outlet 524 for guiding the cooling fluid out of the detoured flow passage.

Further, the aforesaid water outlet 524 and water inlet 523 may be formed in the two ends of the first fluid-cooled heat pipe 51 in fluid communication with the first and last ones of the chambers 512, or respectively formed in the first fluid-cooled heat pipe 51 and the second fluid-cooled heat pipe 52. However, the water outlet 524 and the water inlet 523 cannot be directly connected to same chamber 512 in the first fluid-cooled heat pipe 51 or same chamber 522 in the second fluid-cooled heat pipe 52.

Figure 7:
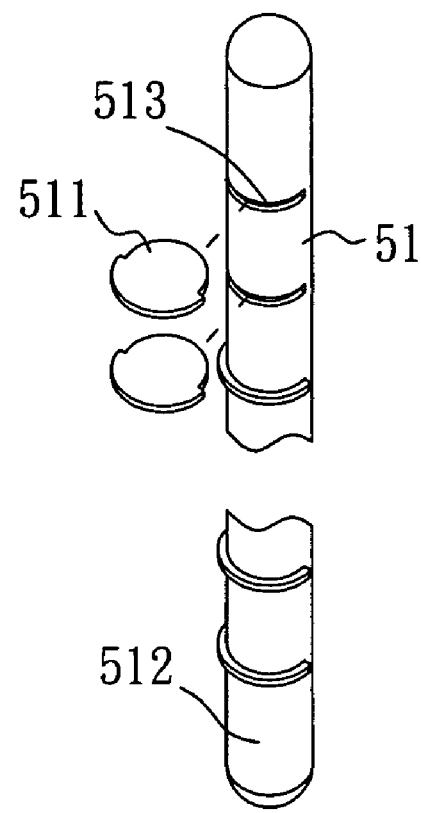
FIG. 7 is a schematic exploded view of the first liquid-cooled heat pipe for the liquid-cooled heat radiator kit according to the present invention.
Figure 8:
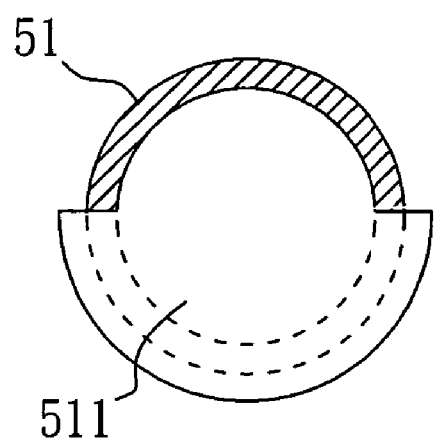
FIG. 8 is a cross-sectional view showing the arrangement of one partition member in the first liquid-cooled heat pipe according to the present invention.

Referring to FIGS. 7 and 8, and FIG. 4 again, the first liquid-cooled heat pipe 51 has a plurality of transverse cuts 513 spaced along the length. The partition members 511 are respectively inserted into the transverse cuts 513 and fixedly sealed to the first liquid-cooled heat pipe 51, dividing the inside space of the first liquid-cooled heat pipe 51 into the aforesaid enclosed chambers 512. The second liquid-cooled heat pipe 52 has a plurality of transverse cuts 526 spaced along the length. The partition members 521 are respectively inserted into the transverse cuts 523 and fixedly sealed to the second liquid-cooled heat pipe 52, dividing the inside space of the second liquid-cooled heat pipe 52 into the aforesaid enclosed chambers 522.

The aforesaid heat radiator 50 may be directly extruded from aluminum. Alternatively, bonding a plurality of radiation elongations 5021 to a flat aluminum block can make the heat radiator 50. The aforesaid first liquid-cooled heat pipe 51, partition members 511, 521, second liquid-cooled heat pipe 52 and flow-guide pipes 53 are respectively made from copper. Further, a phosphor bronze solder rod may be used to seal the copper parts of the liquid-cooled heat radiator kit to one another. When the phosphor bronze solder is melted, phosphor bronze flows into crevices in between the copper parts by means of a capillary effect to fixedly fasten the copper parts together The aforesaid structure completely eliminates the problems caused due to the use of a coiled heat pipe as seen in the prior art design, obtains the maximum contact area between the flow-guide pipes and the radiation elements. When a fan is attached, the heat dissipation effect is greatly enhanced. Further, because straight flow-guide pipes are used, they can be arranged on the heat radiator in a high density to increase the length of the detoured flow passage. Therefore, the fluid staying time in the liquid-cooled heat pipes is greatly increased to enhance cooling effect.

Although the present invention has been explained in relation to its preferred embodiments, it is to be understood that many other possible modifications and variations can be made without departing from the spirit and scope of the invention as hereinafter claimed.

What is claimed is:

1. A liquid-cooled heat radiator kit comprising:
   a heat radiator, said heat radiator comprising a plurality of radiation elements protruded from a top wall thereof and a plurality of parallel grooves formed in a bottom wall thereof;
   a first liquid-cooled heat pipe, said first liquid-cooled heat pipe having two close ends and a plurality of side holes spaced between the two close ends thereof;
   a second liquid-cooled heat pipe, said second liquid-cooled heat pipe having two close ends and a plurality of side holes spaced between the two close ends thereof; and
   a plurality of flow-guide pipes respectively mounted inside the grooves of said heat radiator, each said flow-guide pipe having a right end connected to one of the side holes of said first liquid-cooled heat pipe and a left end connected to one of the side holes of said second liquid-cooled heat pipe;
   wherein, said first liquid-cooled heat pipe further comprises a plurality of partition members, and a plurality of enclosed chambers separated from one another by the partition members of said first liquid-cooled heat pipe; said second liquid-cooled heat pipe further comprises a plurality of partition members, and a plurality of enclosed chambers separated from one another by the partition members of said second liquid-cooled heat pipe;
   wherein, the enclosed chambers of said first liquid-cooled heat pipe and the enclosed chambers of said second liquid-cooled heat pipe are arranged in fluid communication with the right and left ends of said flow-guide tubes in such a manner that the enclosed chambers of said first liquid-cooled heat pipe and said second liquid-cooled heat pipe form with said flow-guide pipes a detoured flow passage for the passing of a cooling fluid in one direction.

2. The liquid-cooled heat radiator kit as claimed in claim 1, wherein said first liquid-cooled heat pipe has a plurality of transverse cuts spaced between the two enclose ends thereof; the partition members of said first liquid-cooled heat pipe are respectively inserted and fastened to the transverse cuts of said first liquid-cooled heat pipe to divide the inside space of said first liquid-cooled heat pipe into said enclosed chambers of said first liquid-cooled heat pipe.

3. The liquid-cooled heat radiator kit as claimed in claim 1, wherein said second liquid-cooled heat pipe has a plurality of transverse cuts spaced between the two enclose ends thereof; the partition members of said second liquid-cooled heat pipe are respectively inserted and fastened to the transverse cuts of said second liquid-cooled heat pipe to divide the inside space of said second liquid-cooled heat pipe into said enclosed chambers of said second liquid-cooled heat pipe.

4. The liquid-cooled heat radiator kit as claimed in claim 1, wherein said second liquid-cooled heat pipe has an inlet in fluid communication with one of the enclosed chambers of said second liquid-cooled heat pipe.

5. The liquid-cooled heat radiator kit as claimed in claim 1, wherein said second liquid-cooled heat pipe has an outlet in fluid communication with one of the enclosed chambers of said second liquid-cooled heat pipe.

6. The liquid-cooled heat radiator kit as claimed in claim 1, further comprising an electric fan mounted on a top side of said radiation elements of said heat radiator.

* * * * *